United States Patent [19]
Hoffmann

[11] 4,067,001
[45] Jan. 3, 1978

[54] LINE FOR TRANSPORTING CHARGES FROM STORAGE ELEMENTS IN A STORAGE FIELD

[75] Inventor: Kurt Hoffmann, Taufkirchen, Germany

[73] Assignee: Siemens Aktiengesellschaft, Germany

[21] Appl. No.: 689,809

[22] Filed: May 25, 1976

[30] Foreign Application Priority Data

May 28, 1975 Germany .............................. 2523683
Feb. 17, 1976 Germany .............................. 2606254

[51] Int. Cl.² .................... G11C 11/40; G11C 13/00
[52] U.S. Cl. .................................. 365/174; 307/238; 357/24
[58] Field of Search .............. 340/173 R, 173 FF; 307/238, 279; 357/24

[56] References Cited

U.S. PATENT DOCUMENTS

| 3,693,003 | 9/1972 | Sigsbee | 340/173 CR |
| 3,760,202 | 9/1973 | Kosonocky | 317/235 G |

OTHER PUBLICATIONS

IBM Tech. Disc. Bul., vol. 14, No. 2, July 1971, "Ramdon Access Potential Ramp Memory for Charge-Coupled Devices," by L. Heller, et al., pp. 485–486.

Primary Examiner—Terrell W. Fears
Attorney, Agent, or Firm—Hill, Gross, Simpson, Van Santen, Steadman, Chiara & Simpson

[57] ABSTRACT

A line as disclosed for transporting charges from one point to another. The substrate of semiconductive material has an electrical insulating layer arranged thereon. Upon this layer, a resistive layer is applied having electrodes at end points thereof for producing a drift field. Diffusion areas are arranged at the end points which are oppositely doped with respect to the semiconductor material situated under the conductive layer. Storage elements in a storage field are connected to the line and write/read circuits are positioned at ends of the line. Taps may be connected at intermediate points along the line to permit application of differing voltages to enhance charge shifting along the line.

9 Claims, 11 Drawing Figures

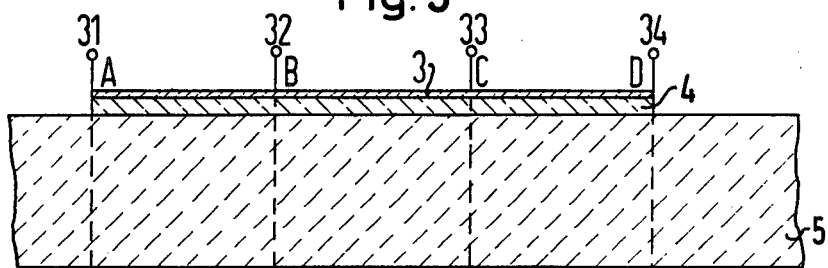
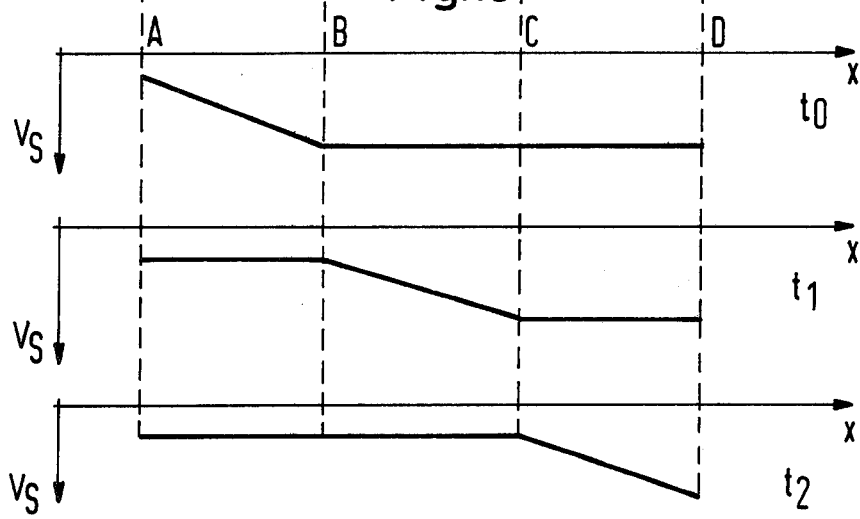
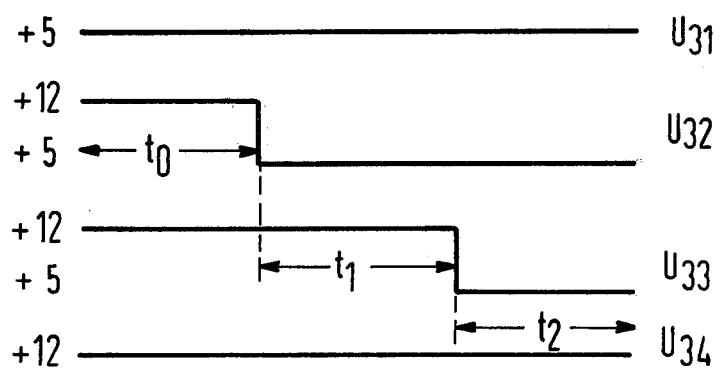

LINE FOR TRANSPORTING CHARGES FROM STORAGE ELEMENTS IN A STORAGE FIELD

BACKGROUND OF THE INVENTION

1. Field of the Invention

This invention relates to a line for transporting a charge from a first point to a second point or for determining from the second point, the charge quantity contained at the first point. More particularly, the invention relates to a bit line for storage elements formed in the storage field.

2. Description of the Prior Art

Means for transporting a charge from a first point to a second point are known. For example, in the publications "A 1-MIL$^2$ Single Transistor Memory Cell in N-Silicon-Gate-Technology", by K. U. Stein, (ISSCC Digest of Technical Papers, Feb. 1973) and in "Storage Array and Sense/Refresh Circuit for Single-Transistor Memory Cells", by K. U. Stein, (ISSCC Digest of Technical Papers, Feb. 1972), a process as described with which a charge quantity at a first point can be determined from a second point. A storage capacitor may be located at a point A, to pass a charge onto the line. As a result, the charge distribution occurs between the storage capacitor and the parasitic capacitance of the line. This charge distribution causes a voltage jump on the line which can be read-out in an evaluation circuit located at point D.

It is a disadvantage of the above system that the voltage jump at point D is very slight since the line has a relatively large parasitic capacity. As a result, the evaluator at point D must have a very high sensitivity.

SUMMARY OF THE INVENTION

It is an object of the present invention to provide a line in which the voltage jump at the output of the line is large so that an evaluator at the output does not require a high sensitivity.

It is a further object of this invention to provide a line which is suitable for charge transfer from storage elements in a storage arrangement.

According to this invention, an MOS line is provided in which a charge placed thereon migrates without loss from a first point to a second point so that a large voltage jump will occur at the other end of the line. Consequently, design criteria for the regeneration circuits at the end of the line are not too demanding.

In the MOS line of this invention, a substrate of semiconductor material is provided which has an electrical insulating layer arranged thereon. Upon this insulating layer a resistive layer is applied having electrodes at either end of the line. Differential voltages are applied to the resistive layer such that a depletion zone occurs below the resistive layer through which the charges may migrate from one end of the line to the other.

BRIEF DESCRIPTION OF THE DRAWINGS

FIG. 9 schematically illustrates an MOS line of this invention having taps intermediate the end points of the line;

FIG. 10 illustrates surface potentials along the line at various times;

FIG. 11 is a graph illustrating the pulses applied to operate the MOS line of FIG. 9.

DESCRIPTION OF THE PREFERRED EMBODIMENTS

Figure 1:
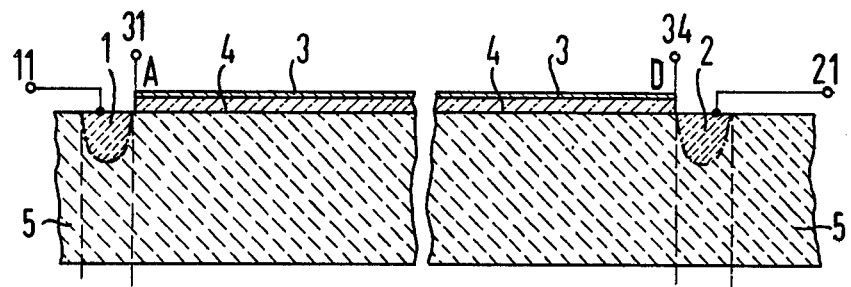
FIG. 1 illustrates a schematic representative of the integrated MOS line of this invention.

In FIG. 1 an MOS line of this invention is shown which is constructed on a substrate 5 consisting of semiconductor material. This substrate is preferably a silicon substrate which is, for example, p-doped. In substrate 5, n-doped areas 1 and 2 are provided at opposite ends of the substrate. Area 1 is connected to an input terminal 11 and area 2 is connected to an output terminal 21. Between areas 1 and 2, the MOS line of this invention is arranged having end points A and D.

To create the MOS line, an electrical insulating layer 4, preferably consisting of $SiO_2$, is applied on the substrate 5 between areas 1 and 2. On this layer, an electrode 3 preferably consisting of doped polysilicon or aluminum is arranged as shown in FIG. 1. At point A, electrode 3 is provided with a terminal 31 and at point D is provided with a terminal 34. When a gate voltage $+V_A$ is applied to the electrode 31 and a voltage $+V_D$ is applied to the electrode 34, a depletion zone is produced beneath the MOS line. A charge can enter this depletion zone at input 11, for example. This input 11 is connected to a diffusion area 1 and has brief pulses applied to it in such a fashion that charges reach the semiconductor surface of the MOS line over the potential barrier $+V_{SA}$.

As will be described later, a charge may be brought into the diffusion area by use of a storage capacitor such as a single-transistor storage element which presents its charge onto the MOS line via a selection transistor.

Figure 3:
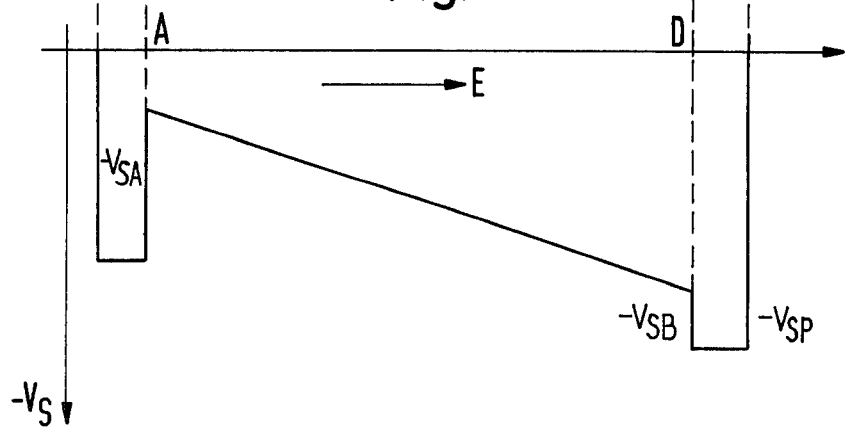
FIG. 3 is a graph illustrating the surface potential at various portions of the MOS line.
Figure 2:
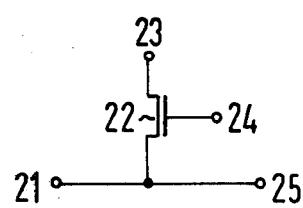
FIGS. 2 and 4 are schematic representations of output stages for evaluating a voltage change at an end point of the line.

When a p-type substrate 5 is employed, the charge carriers are of a negative type. The output 21 of the MOS line has a diffusion area 2 which functions in a manner similar to a capacitor. If the output 21 is connected to an output stage such as shown in FIG. 2, then the diffusion area 2 can be charged to a surface voltage $+V_{SP}$ with the aid of a transistor 22. For this purpose, a voltage $+V_P$ is presented at the terminal 23 of the transistor 22. For precharging, the transistor 22 is put into a conductive state with the aid of a precharge signal P applied at the gate terminal 24 of transistor 22. If the voltages at the end points A and D are chosen such that $/V_D/ > /V_A/$, then, as shown in FIG. 3, a potential distribution along the surface $V_S$ creates a drift field E along the MOS line between points A and D. This drift field E causes charges brought in at A to migrate along the semiconductor surface to area 2 having the surface potential $+V_{SP}$ the value to which the diffusion area 2 is precharged by the transistor 22 prior to a change to a more positive value as a result of the migrating charge received at area 2. This potential change can be used to determine the presence of the charge.

Figure 4:
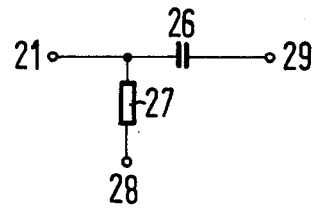

Another type of output stage is shown in FIG. 4. If a charge migrates to area 2, then a voltage change occurs across resistance 27 which is balanced with the capacitor 26.

Figure 5:
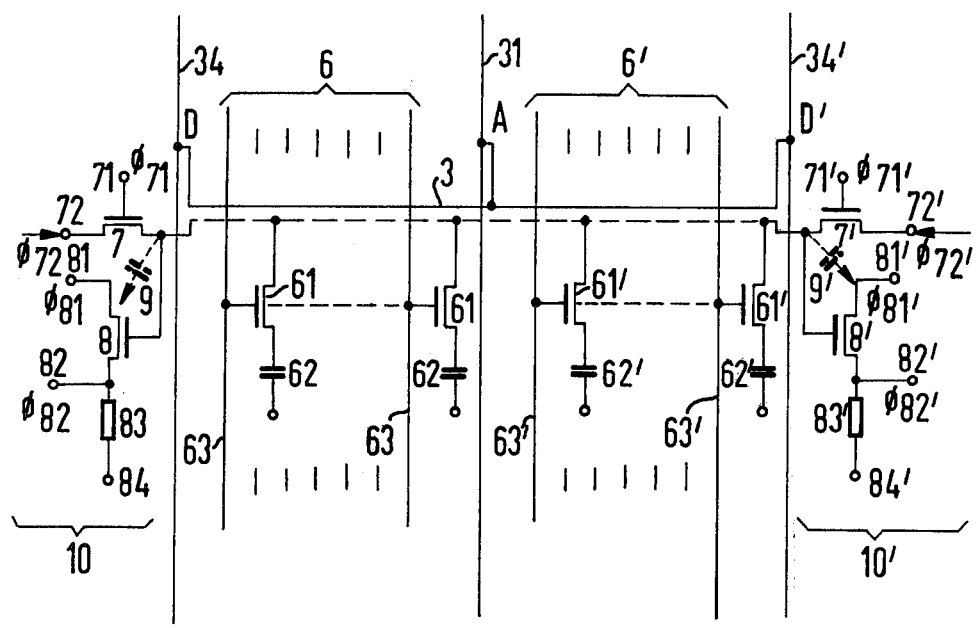
FIG. 5 is a schematic diagram illustrating the MOS lie of this invention used in connection with single-transistor storage elements.
Figure 8:
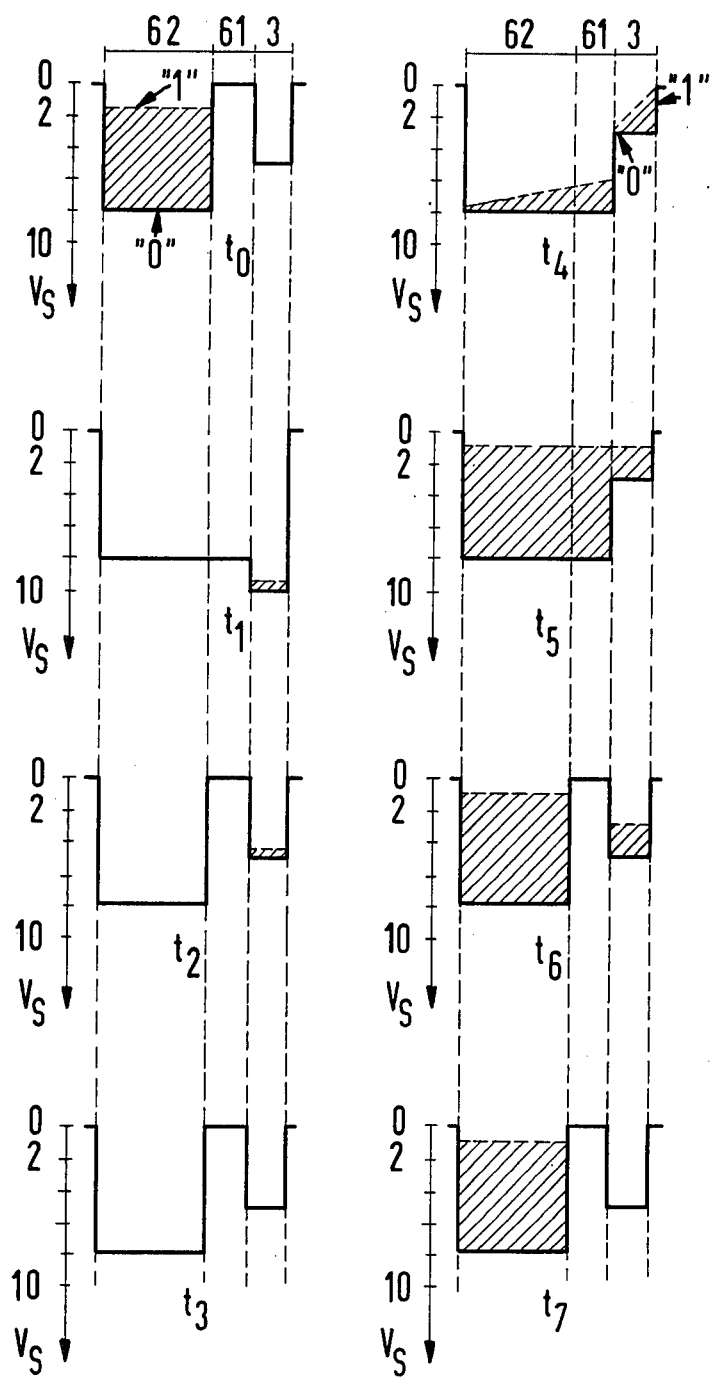
FIG. 8 illustrates various surface potentials during writing and reading.

With reference to FIGS. 5 and 8, the function and application of the MOS line of this invention will be described in connection with single-transistor storage elements formed as a storage field. The use of the MOS line of this invention as a bit line in storage fields formed with other types of storage elements is appropriate.

In FIG. 5, an integrated circuit having single-transistor storage elements is shown together with the MOS line of this invention. Such single-transistor elements are described in the publication "Storage Array and Sense/Refresh Circuit of Single Transistor Memory Cells".

The MOS line of this invention is used as a line of the storage matrix represented in FIG. 5. Single-transistor storage elements of this line are designated 6 or 6′, respectively. Each single-transistor storage element consists of a selection transistor 61 or 61′ and of a storage capacitor 62 or 62′. Transistor 61 or 61′ is connected at one end to a storage capacitor 62 or 62′, respectively, and at the other end to the bit line formed as the MOS line 3 of this invention. The selection transistor 61 or 61′ is triggered via selection line 63 or 63′, respectively. The MOS line 3 is preferably arranged symmetrically such that at ends of the line D or D′ a write-read circuit is arranged such that data information from or to the left half 6 or the right half 6′ of the storage field can be written-in or read-out. Such an arrangement is advantageous since a charge only migrates through half of the MOS line 3 so that the write-read time is shortened.

Figure 6:
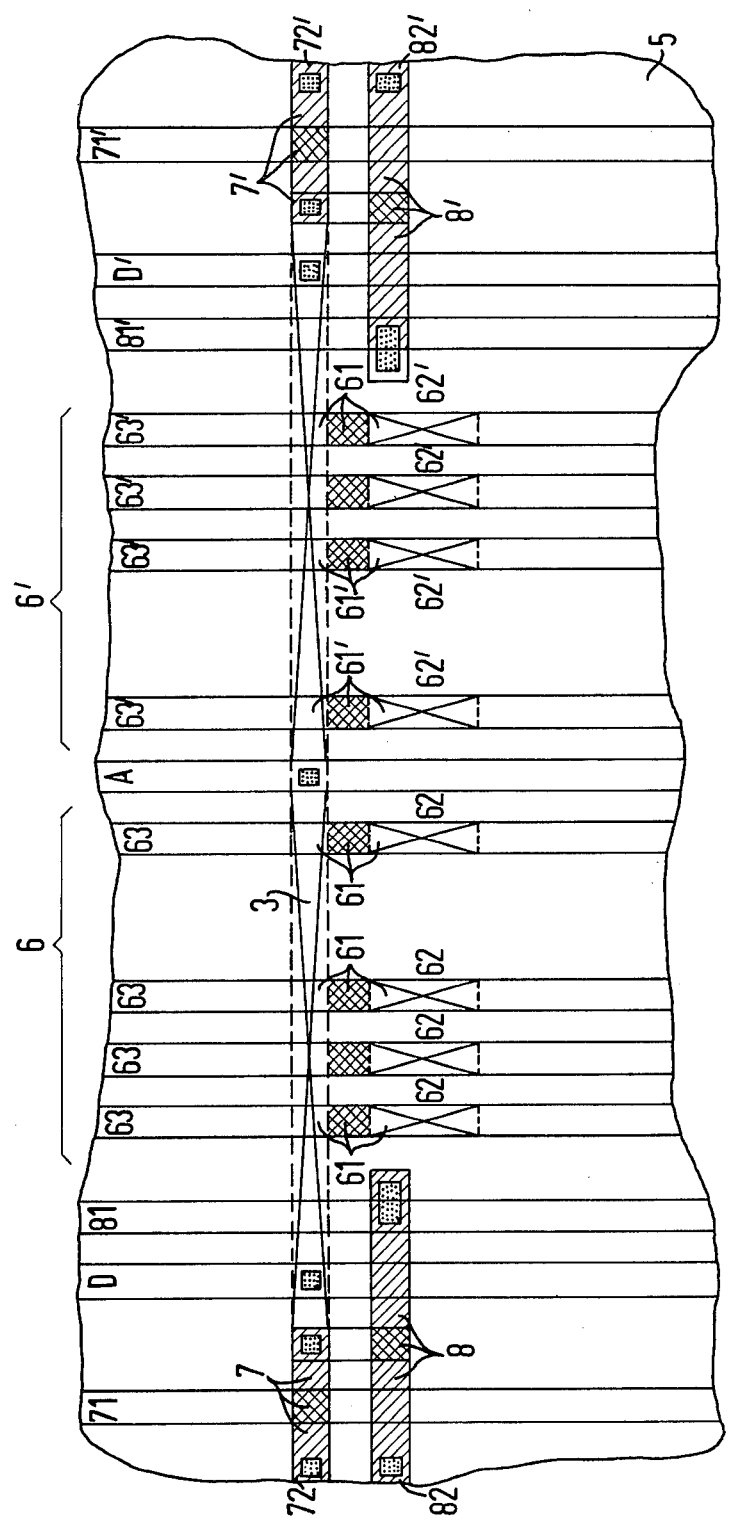
FIG. 6 shows an embodient in Al-Si-Gate technology for the circuit shown in FIG. 5.

FIG. 6 illustrates an implementation of the circuit shown in FIG. 5 using an aluminum-silicon-gate technology. Elements of FIG. 6 already described in connection with FIG. 5 have the same reference numerals. In FIG. 6, diffusion areas arranged in the substrate 5 are represented by obliquely hatched surfaces. Aluminum conductor paths have heavily bordered surfaces. Silicon gate regions, such as the electrode of the MOS line 3 and the electrodes of the storage capacitors 62 or 62′, are shown by rectangular surfaces having crossed diagonal lines. Aluminum gate regions are designated by cross-hatched surfaces and contact holes by dotted surfaces.

Figure 7:
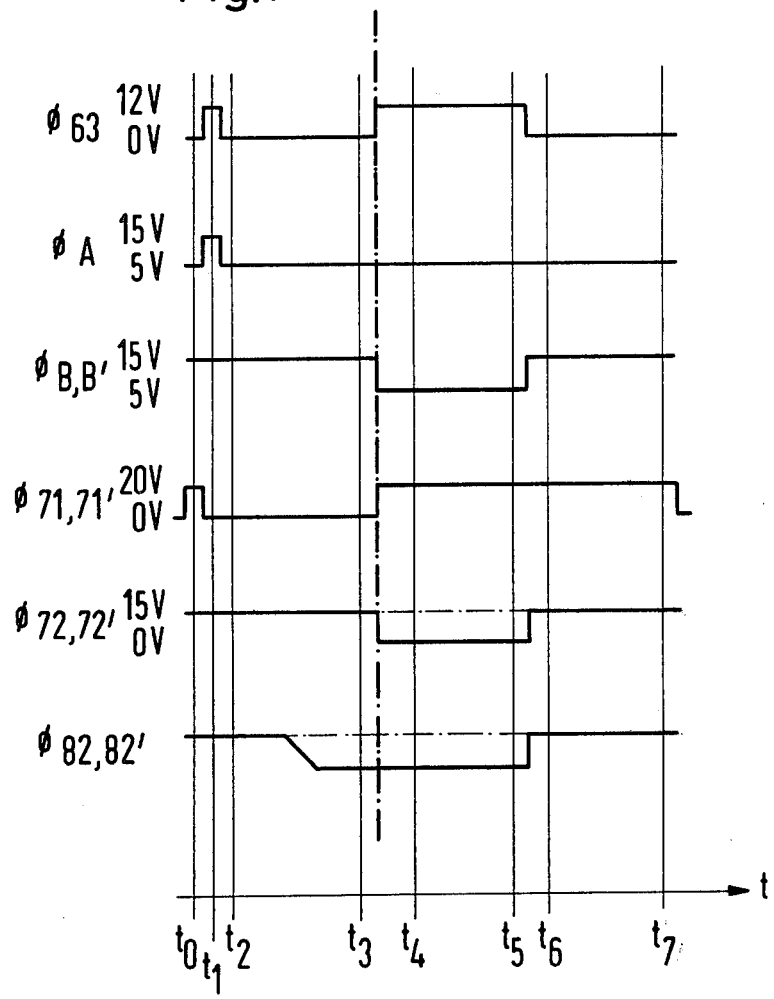
FIG. 7 is a graph illustrating the pulse timing for read-out and write-in with respect to the circuit of FIG. 5.

The function of the circuit shown in FIG. 5 may best be explained with reference to FIGS. 7 and 8 showing time relationships and surface potentials. In FIG. 8, the binary states "1" and "0" respectively represent the presence or absence of charge in the storage capacitor 62 or 62′.

A read-cycle begins at time $t_0$ when the transistor 7 or 7′ is pulsed with a signal $\phi_{71}$ or $\phi_{71'}$ at the gate terminal 71 or 71′. At the same time, a positive potential $\phi_{72}$ or $\phi_{72'}$ is applied to input terminal 72 or 72′. As a result, capacitor 9 or 9′ consisting of a diffusion capacitance and a gate capacitance of transistor 8 or 8′ is precharged.

At time $t_1$, a selection transistor 61 or 61′ is activated. Simultaneously, an identical positive result, $\phi_A = \phi_B$ or $\phi_A = \phi_{B'}$ is applied to both ends of the MOS line. This causes the charge to pass into the depletion zone of the MOS line through the aid of selection line 63 or 63′ from the storage capacitor 62 or 62′. After the selection transistor is switched into the blocking condition at $t_2$, a drift field is produced by reduction of the potential at $\phi_A$ at the MOS line. As a reslt, the charge migrates to the output at time $t_3$ and discharges the biased capacitor 9 or 9′. At the output of transistor 8 or 8′, operated as a source circuit, an output voltage $\phi_{82}$ or $\phi_{82'}$ occurs which is proportional to the charge quantity to be read. The source circuit can, as shown in FIG. 5, be connected with a resistance 83 or also with a capacitor. In this case, however, the voltage $\phi_{81}$ must be correspondingly pulsed.

The writing-in into a storage element always occurs in conjunction with a prior read-cycle so that the addresssed storage element is cleared of charge and read-out before the writing. Digital information to be written in, such as a binary "0" and "1" respectively represented by a voltage $\phi_{72}$ or $\phi_{72'}$ (for example, 15 V and 0 V) is present at the input 72 or 72′. At time $t_4$, the transistor 7 or 7′ is switched conductive with the aid of voltage $\phi_{71}$ or $\phi_{71'}$. As a result, in the case of a binary "1" at the input 72 or 72′, a charge passes into the depletion zone of the MOS line. Since transistor 7 or 7′ remains switched conductive during the entire write operation. an inversion layer is formed in the depletion zone which, after a period of time, has a uniform charge distribution since both gate voltages have the same value $\phi_A = \phi_B$. The charge from the inversion layer charges the addressed storage capacitor 62 or 62′ via the address transistor 61 or 61′. Once the storage capacitor and the MOS line have the same surface potential at time $t_5$, the selection transistor 61 or 61′ is switched off at time $t_6$ and the gate voltage $\phi_B$ or $\phi_{B'}$ is increased. As a result, a drift field is produced in the depletion zone such that the charge still present in the line migrates back to the input 72 or 72′ and, with the aid of voltage $\phi_{72}$ or $\phi_{72'}$ is drained off there. Thus, the semiconductor surface of the MOS line is cleared of charge carriers at time $t_7$ and primed for the next read-write cycle.

In FIG. 9, an alternate embodiment for the MOS line of this invention is shown. The line is constructed on substrate 5 consisting of a semiconductor material which is preferably silicon and which may have p-type doping, for example. On the substrate 5 an electrical insulating layer 4 preferably consisting of $SiO_2$, is applied between ponts A and D as shown in the figure. On this layer, a resistance electrode 3 which preferably consists of doped polysilicon, is arranged in the manner shown in the figure. This resistance electrode connects to a terminal 31 at point A and a terminal 34 at point D. Between points A and D at least one further terminal or tap is provided. As shown in FIG. 9, two additional taps have been added, namely a tap 32 at point B and a tap 33 at point C. Preferably the taps are separated from one another by equal intervals.

The operation of the MOS line of FIG. 9 is most easily understood by reference to FIGS. 10 and 11. The transit time of the MOS line is decreased since the drift field is increased with the aid of taps 32 and 33 at the resistance electrode. These taps permit the gate voltage pulses shown in FIG. 11 to be applied to taps 31-34 in succession so that an increased drift field migrates with the charge package to the output. Surface potential formed at various times is shown in FIG. 10.

As an example of typical operation, a tap 31 at point A always has the same potential applied, such as +5V. Taps 32, 33 and 34 may initially have a greater potential applied, such as +12V. This causes a drift field to be produced between points A and B, that is between taps 31 and 32, such that charges situated at point A are shifted to point B. Once the charge package has arrived at point B, the high potential of +12V present at tap 32 is pulsed to a low potential, namely +5V. As a result, the drift field now occurs between points B and C so that the charge package is shifted to point C. In corresponding manner, when the charge package arrives at point C, the high potential present at tap 33 is pulsed to a low potential so the drift field then occurs between taps 33 and 34. Consequently, the charge then shifts to point D.

It should be obvious to those skilled in the art that several taps may be provided along the MOS line. To calculate the median transit time the following formula is appropriate:

$$T_U = \frac{L^2}{m^2 \mu \gamma \Delta V_G}$$

In this formula, $\Delta V_G$ signifies the voltage difference between the taps producing the drift field. $\gamma$ signifies a constant which is derived from the construction technology utilized and typically lies between 0.6 and 0.8; and $\mu$ signifies the mobility of the charge carriers. "$m$" signifies the number of line intervals into which the MOS line is divided. As can be seen from the formula, the transit time of the MOS line of this invention is decreased by the factor $(1/m)^2$.

For transporting a charge into the drift field of the MOS line, it is possible for a diffusion area to be provided at point A as previously described. Also, the output of the MOS line can consist of a diffused area at the other end of the MOS line to which output stages are connected.

As previously shown in FIGS. 5 and 6, the MOS line of this invention can be used as a bit line in connection with storage elements to form a storage field. To utilize the embodiment of FIG. 9 having additional taps intermediate end points of the line, all that is required is the addition of taps between points A, D and D'. Consequently, transit time can be substantially decreased for the structure of FIG. 6.

Although various minor modifications may be suggested by those versed in the art, it should be understood that I wish to embody within the scope of the patent warranted hereon, all such embodiments as reasonably and properly come within the scope of my contribution to the art.

I claim as my invention:

1. A method for rapidly transferring a charge from a first point to a second point along a line having a semiconductor material region, a layer of insulating material on said region, and a resistance layer on said layer of insulating material, said resistance layer having first and second end terminals and a first intermediate terminal, comprising the steps of:
   a. maintaining a relatively low potential on said first end terminal;
   b. introducing a charge into one end of said semiconductor material region adjacent the first end terminal;
   c. transporting said charge from near the first end terminal to near the first intermediate terminal, by applying a relatively high potential to said first intermediate terminal to create a continuously changing potential beneath said resistance layer between the first end and first intermediate terminals;
   d. transporting said charge from near the first intermediate terminal to near the second end terminal by applying a relatively low potential to said first intermediate terminal to replace the high potential and applying a relatively high potential to said second end terminal to create a continuously changing potential beneath said resistance layer between the second end and first intermediate terminals.

2. The method of claim 1 comprising the additional step of applying a relatively high potential to a second intermediate terminal when said first intermediate terminal is replaced with the relatively low potential, and then replacing the high potential on said second intermediate terminal with a low potential.

3. A line for transporting a charge package from a first point to a second point, comprising:
   a. a region of doped semiconductor material;
   b. an electrical insulating layer on said region;
   c. a resistance layer means on said insulating layer for creating a continuously changing potential therebeneath;
   d. first and second terminals connected at first and second end points on said resistance layer and an intermediate terminal therebetween; and
   e. means for applying a relatively low potential to said first terminal and a relatively high potential to said intermediate terminal for creating a continuously changing depletion layer and drift field in a portion of said semiconductor region beneath and between said first and intermediate terminals and means for applying a relatively low potential to said intermediate terminal and a relatively high potential to said second terminal for creating a continuously changing depletion layer and drift field in a portion of said semiconductor region beneath and between said intermediate and second terminals.

4. A storage field comprising in combination:
   a. a line for transporting a charge package rapidly between intermediate points and end points, said line including
      i. a region of first conductivity type semiconductor material;
      ii. an electrical insulating layer on said region;
      iii. an electrical resistance layer means on said insulating layer for producing a continuously changing potential between the intermediate point and end points of the line;
      iv. end electrodes and an intermediate electrode connected to said resistance layer means to enable the production of a drift field in the line of continuously changing potential when differing potentials are connected between the intermediate electrode and end electrodes;
   b. storage elements connected along the line on both sides of said intermediate electrode; and
   c. a write-read circuit connected at each end of the line,
whereby write-read circuits of low sensitivity may be employed and rapid charge transfer between the storage elements and each of the read-write circuits is obtained.

5. The storage field of claim 4 in which the line intermediate electrode is centrally located between the end electrodes on the resistance layer means.

6. The field of claim 5 in which each write-read circuit has a first transistor with a channel, one end of the channel corresponding to a diffusion area at one of the ends of said line, a first potential connected to the other end of said channel, a control input at a gate electrode of said first transistor, a second transistor having a gate electrode connected to said first transistor channel, a second potential connected to one end of a channel of said second transistor, the other end of said channel being connected to an output.

7. The field of claim 6 in which a load element is connected to said output.

8. The field of claim 6 in which a capacitor is connected to said output.

9. The field of claim 4 in which at least one further electrode is connected to the resistance layer means of the line between each end electrode and the intermediate electrode.

* * * * *